United States Patent [19]
Blythe et al.
[11] 3,878,488
[45] Apr. 15, 1975

[54] DIGITAL NON-LINEAR FREQUENCY CONTROL

[75] Inventors: Wayne T. Blythe, Wake Forrest, N.C.; Albert J. Micheizler, Ellicott City, Md.

[73] Assignee: The United States of America as represented by the Secretary of the Army, Washington, D.C.

[22] Filed: Apr. 30, 1974

[21] Appl. No.: 465,466

[52] U.S. Cl. .................... 334/39; 334/11; 307/233; 307/271; 325/468
[51] Int. Cl. .......................... H03j 1/06; H03k 1/16
[58] Field of Search ........... 34/11, 39, 89; 325/468; 307/233, 271; 324/166, 166 D, 175

[56] References Cited

UNITED STATES PATENTS

| | | | |
|---|---|---|---|
| 3,299,295 | 1/1967 | Goda | 307/233 |
| R26,630 | 7/1969 | Peaslee | 307/271 |

FOREIGN PATENTS OR APPLICATIONS

| | | | |
|---|---|---|---|
| 953,036 | 3/1964 | United Kingdom | 324/174 |
| 1,078,221 | 8/1967 | United Kingdom | 307/233 |

*Primary Examiner*—Alfred E. Smith
*Assistant Examiner*—Wm. H. Punter
*Attorney, Agent, or Firm*—John R. Utermohle; Thomas O. Maser

[57] ABSTRACT

An electro-mechanical apparatus is disclosed with which one may effect fine/coarse frequency tuning by means of a single tuning knob. The rate of rotation of the tuning knob is sensed to control the rate of a digital pulse train, which in turn is sensed and compared with predetermined threshold values. Below a first threshold value, the tuner frequency is altered at a rate proportional to the rate of rotation of the tuning knob, thereby providing fine tuning control. Between the first and a second threshold value the tuner frequency is altered at a constant rate which may be several times the maximum proportional tuning rate, thereby providing intermediate coarse tuning. Above the second threshold value the tuner frequency is altered at a constant rate which may be many times the intermediate coarse tuning rate, thereby providing rapid coarse tuning.

8 Claims, 4 Drawing Figures

DIGITAL NON-LINEAR FREQUENCY CONTROL

BACKGROUND OF THE INVENTION

This invention relates generally to the frequency tuning of electronic apparatus, for example, radio receivers, and more particularly to radio receivers wherein it is desirable to have fine tuning capability together with the capability to rapidly tune from one end of the frequency spectrum to the other.

Knob tuning of a radio receiver is generally performed by one of two methods. A first method, utilizing a single tuning knob, operates with the rate of tuning proportional to the rate of rotation of the knob. If fine tuning of the receiver is required, it is necessary that rotation of the knob through a relatively large arc result in a relatively small change in frequency. This type of operation has severe disadvantages when it is necessary for the operator to continuously tune from one end of the frequency spectrum to the other, for the method is both slow and physically tiring. A second apparatus for knob tuning requires two knobs, one for fine tuning and one for coarse tuning. Both knobs operate in a linear manner, with the rate of tuning proportional to the rate of rotation of the tuning knobs. When using this type of tuner, an operator first utilizes the coarse tuning knob, which provdes a relatively large degree of tuning over the frequency spectrum with a relatively small amount of angular rotation, to reach the region of interest within the frequency spectrum. He then must use the fine tuning knob, which provides a relatively small amount of tuning over the frequency spectrum for a relatively large amount of angular rotation, to accurately tune to the frequency he desires.

It would be a significant advantage in many receivers to combine the fine-coarse advantages of the two-knob type of tuner with the simplicity and ease of operation of a one-knob system, and it is to this end that the present invention is directed.

SUMMARY OF THE INVENTION

It is a purpose of this invention to provide a frequency control having both fine and coarse tuning capability, and utilizing only a single tuning knob.

It is a further object to provide a frequency control having all digital components, with outputs compatible with computer controlled receivers.

It is also an object to provide a frequency control allowing continuous scanning over a broad frequency spectrum in a rapid and non-tiring manner.

A still further object is to provide a frequency control having both fine and coarse tuning capability, wherein the tuning is accomplished electronically.

Frequency control apparatus having these and other advantages would include a tuning knob; a source providing a first pulse train at a rate proportional to the rate of rotation of the tuning knob; a means for comparing the rate of the first pulse train with some predetermined rate; a source for providing a second pulse train; an apparatus for tuning a receiver or similar device; and a means for switching to the tuning apparatus the first pulse train if the rate of the first pulse train is less than the predetermined rate, and the second pulse train if the first pulse train is greater than the predetermined rate.

DESCRIPTION OF THE PREFERRED EMBODIMENT

Basically, the apparatus described herein senses the rate of rotation of a tuning knob and provides to a series of up/down counters a train of pulses, the pulse rate being either linearly or nonlinearly related to the speed of rotation of the knob. The outputs of the counters are then used to effect the actual tuning of a receiver in any of a number of ways known in the art, an understanding of which is not essential to the understanding of this invention.

Figure 1:
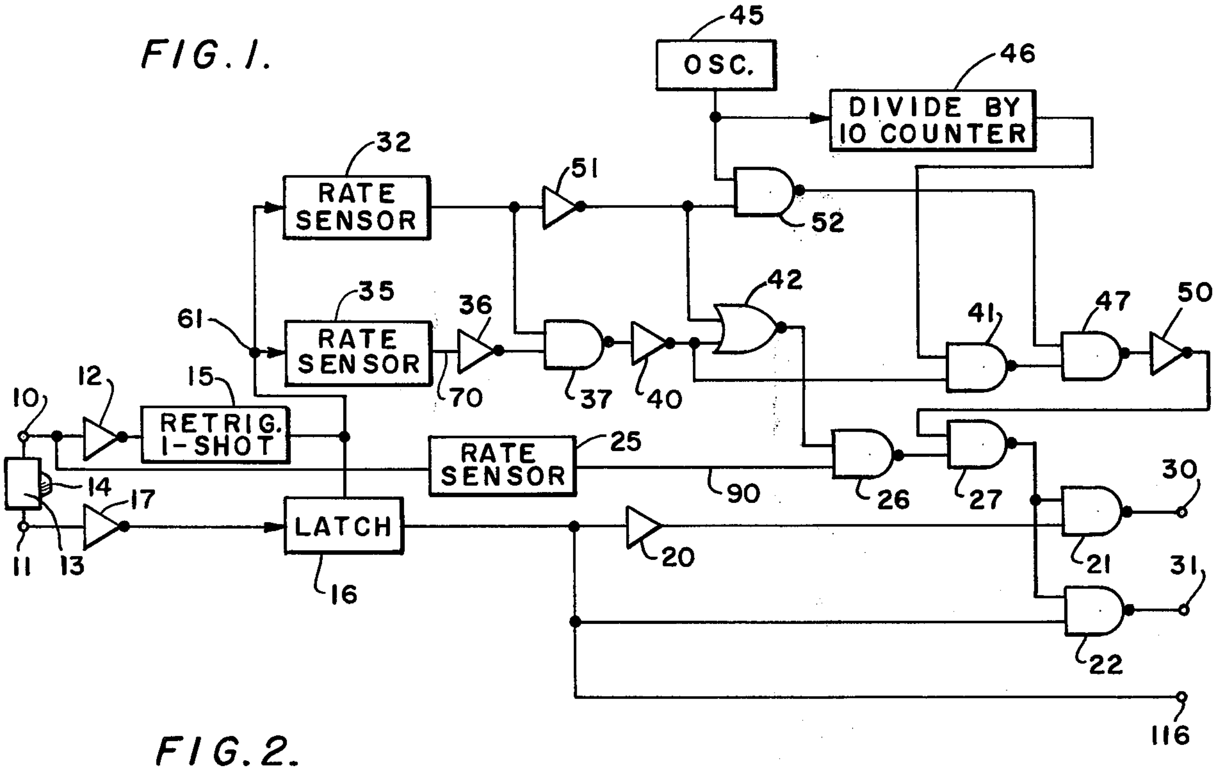
FIG. 1 is a block diagram of the direction sensing circuitry and the pulse train control circuitry for a digital nonlinear frequency control circuit embodying the invention.

Referring to FIG. 1, terminals 10 and 11 are inputs to which are connected an electronic optical shaft encoder 13 such as may be obtained from Dynamics Research Corporation. The shaft encoder 13 has two phase-related outputs, each of which is a train of pulses whose relative phase relationship changes as a function of rotational direction. The rate of pulses from the encoder is linearly related to the speed of rotation of a tuning knob 14 attached thereto. A signal applied at terminal 10 operates through pulse shaping inverter 12 to activate a monostable multivibrator (one-shot) 15. The one-shot 15 may be of either the retriggerable type (such as model SN74123 of the Texas Instruments Corporation) or the non-retriggerable type (such as model 8162 of the Texas Instruments Corporation). This circuit must be adjusted to provide a distinct pulse output for each pulse incoming at terminal 10. Pulses appearing at terminal 11 are applied to the input of a latch (such as TI model SN7475) 16 through pulse shaping inverter 17. Pulses from the output of the one-shot 15 trigger the latch 16, thereby sampling the input provided on terminal 11 at that instant. The phase relationship of the pulses at the terminals 10 and 11 are such that the output of the latch 16 will be 1 or 0 depending on the direction of rotation of the tuning knob. Specifically, the output of the latch will be logic 0 if the operator is tuning down the frequency scale, and the output of the latch will be 1 if the operator is tuning up the frequency scale. This output is communicated through an inverter 20 to a NAND gate 21, and also directly to a NAND gate 21 and a terminal 116.

The circuit of FIG. 1 operates in three distinct speed ranges. In the first, lowest speed range, pulses appearing at terminal 10 trigger a rate sensor circuit 25 which in turn provides pulses thru NAND gates 26 and 27 to the NAND gates 21 and 22. Depending upon the direction of rotation of the tuning knob 14, either NAND gate 21 or 22 will be deactivated, with the pulses from the NAND gate 27 passing through the other. Specifically, if the output of the latch 16 is logic 0, indicating that the operator is tuning down the frequency scale, the logic 0 signal passes through the inverter 20 to produce a logic 1 at the input of the NAND gate 21 while providing a logic 0 to the input of the NAND gate 22. The logic 0 input deactivates the NAND gate 22, allowing signals to pass only through the NAND gate 21 to the terminal 30. This terminal is connected to the down input of the counters 100*a*–100*f* (FIG. 4), further described herein below. Similarly, if the operator is tuning up the frequency scale, the output of the latch 16 will be logic 1, passing a logic 0 to the input of the NAND gate 21, thereby deactivating it. The logic 1 is passed directly to the input of the NAND gate 22, allowing pulses from the NAND gate 27 to pass through terminal 31 to the up inputs of the counters 100*a*–100*f*. During operation in this first speed range, the outputs of the rate sensing circuits 32 and 35 are continuously a logic 1, thereby deactivating those portions of the circuit.

If the pulses applied at terminal 10 increase above the first predetermined rate, the output of the rate sensing circuit 35 falls to a logic 0, which, when inverted by an inverter 36, provides a logic 1 to the input of a NAND gate 37. Because the second input to the NAND gate 37 remains continuously at a logic 1 in this speed range, the output of the NAND gate 37 falls to a logic 0, which, when inverted by an inverter 40, provides a logic 1 to a NAND gate 41 and a NOR gate 42. The second input to the NOR gate 42 is continuously at logic 1 in this speed range, resulting in a continuous logic 0 at its output thereby deactivating the NAND gate 26.

An oscillator 45, or a similar source, provides pulses at some predetermined rate, such as 75KHz, to a divide-by-10 counter 46. The divisor 10 is used merely for illustrative proposes, and could be any other value to meet a particular requirement. Pulses from the counter 46 pass through enabled NAND gates 41 and 47, and through an inverter 50 and the enabled NAND gate 27 to the NAND gates 21 and 22. Depending upon the direction of rotation of the tuning knob, as described herein above, these pulses will pass through the appropriate NAND gate to the terminal 30 or 31, thereby stepping the tuning counters 100a-100f in the proper direction.

As the rate of rotation of the tuning knob 14 increases beyond a second predetermined value to the rate speed sensing circuit 32 is triggered, causing its output to fall to a logic 0. This signal inhibits the NAND gate 37 which controls the lower predetermined rate, and, acting through an inverter 51, enables a NAND gate 52. Signals from the oscillator 45, at the higher predetermined rate, are then passed through the NAND gates 52 and 47, the inverter 50, and the NAND gate 27 to the inputs of the NAND gates 21 and 22. As described previously, the direction of rotation of the tuning knob 14 will determine which of the NAND gates 21 or 22 is enabled, allowing the pulses to pass to the terminal 30 or 31 as appropriate to step the tuning counters in the proper direction.

It should be obvious that the various NAND and NOR gates described above and shown in FIG. 1 operate collectively as a multiple switch, routing to the proper output a pulse train when rate is determined as previously described.

The description herein above describes three distinct modes of operation of the circuit of FIG. 1. As the tuning knob 14 is turned at a rate below a first predetermined value, pulses are supplied to the terminals 30 or 31 (depending upon the direction of rotation of the tuning knob) at a rate linearly proportional to the rate of rotation of the knob. As the rate of rotation of the tuning knob 14 is increased above the first predetermined rate, but below a second predetermined rate, pulses are supplied to the appropriate terminals 30 or 31 at a steady rate which is some fraction of the pulse rate of the oscillator 45, that fraction being determined by the counter 46. It is contemplated that this rate will be substantially greater than the maximum rate of the linear mode. As the rate of rotation of the tuning knob 14 is increased beyond the second predetermined value, pulses are applied to the appropriate terminals 30 or 31 at a steady rate equal to the output rate of the oscillator 45.

Figure 2:
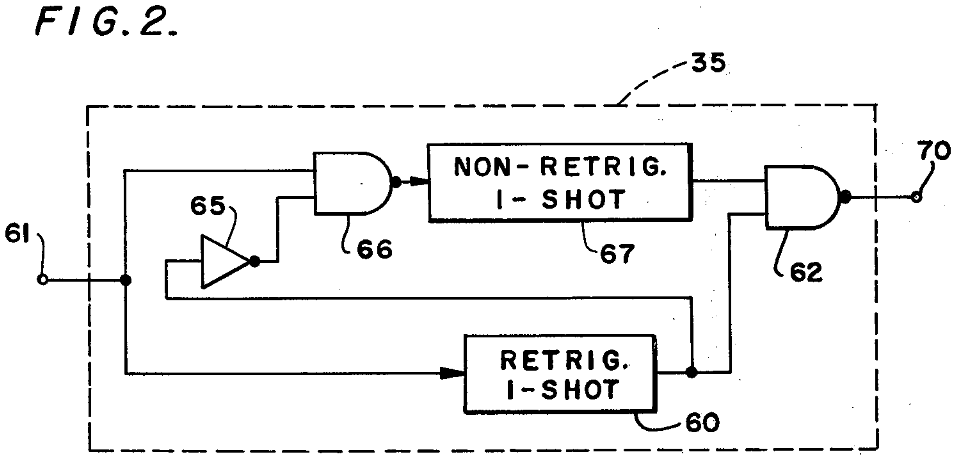
FIG. 2 is a more detailed block diagram of the rate sensor circuits 32 and 35 shown in FIG. 1.

Referring to FIG. 2, the speed sensing circuit 35 is shown in greater detail. Both of the circuits 32 and 35 are identical both in physical construction and operation, although they are adjusted to trigger at different input rates. The circuit consists of a retriggerable one-shot 60 whose input is coupled from the one-shot 15 via terminal 61. The output of the retriggerable one-shot 60 is coupled to a NAND gate 62 and an inverter 65, which is coupled to one input of a NAND gate 66. A retriggerable one-shot is, for purposes of this description, a monostable multivibrator which remains in its unstable state for some predetermined period of time after being triggered by an activating pulse on its input. If a second retriggering pulse occurs on the input before the one-shot has returned to its stable state, the unstable state period begins anew. Similarly, a non-retriggerable one-shot is a monostable multivibrator which can be triggered again only after it has returned to its stable state. The second input of the NAND gate 66 comes from the one-shot 15 via terminal 61, and its output is coupled to a non-retriggerable one-shot 67. The second input of the NAND gate 62 comes from the non-retriggerable one-shot 67, with the output of the NAND gate 62 constituting the output of the circuit 35 via terminal 70. With the circuit in a steady state, that is, with the tuning knob 14 stationary, the signal at terminal 61 is a logic 1. The outputs of the retriggerable one-shot 60 and the NAND gate 66 are at a logic 0, with the outputs of the NAND gate 62 and the non-retriggerable one-shot 67 being a logic 1.

A transistion of the signal at terminal 61 to a logic 0 triggers the one-shot 60, and simultaneously the 0 at the input of NAND gate 66 causes its output to get a logic 1, triggering the one-shot 67. When triggered, the normally low output of the one-shot 60 goes to a logic 1, and the normally high output of the one-shot 67 goes to a logic 0. The time duration in which the one-shots remain in their unstable state is easily controlled by the circuit designer. It is necessary that the retriggerable one-shot 60 remains in its unstable state some period of time which is fractionally less than does the non-triggerable one-shot 67. If pulses entering the circuit at terminal 61 have a duration below a value determined by the duration of the unstable states of the one-shots 60 and 67, the output of the one-shot 60 will first rise to a logic 1, but will fall back to logic 0 before the second pulse is received on its input. The output of the one-shot 67, which has an unstable state pulse duration longer than that of the one-shot 60, will remain low throughout the process. Therefore, the output at the terminal 70 remains at a logic 1 throughout the process. Any narrow spike pulses which may arise during the initial stages of this sequence due to gate delays have been found to have no debilitating effect on the operation of the circuit. If pulses entering at the terminal 61 exceed the rate determined by the unstable pulse duration of the one-shot 60, its output remains at a logic 1 continuously, the 1 passing through the inverter 65 to turn off the NAND gate 66, thereby preventing additional retriggering pulses from reaching the input of the one-shot 67. When the output of the one-shot 67 returns to its normally high stable state, the output of the NAND gate 62 falls to a logic 0, and remains in that state until the pulses at terminal 61 return to the lower rate. It may be noted from the above description that the one-shots trigger on different edges of the pulses: one-shot 67 triggers on the rising edge while one-shot 60 triggers on the following edge.

The rate sensor 32 operates in an identical manner, the only difference between the circuits 32 and 35 being the designer's adjustment to the duration of the unstable state of the various one-shots. In this embodiment, the retriggerable and one-retriggerable one-shots of the rate sensor 32 were adjusted to have unstable pulse durations of 0.7 and 0.8 msec. respectively. Similarly, the retriggerable and non-retriggerable one-shots of the rate sensor 35 were adjusted to have unstable pulse durations of 1.1 and 1.2 msec. respectively.

Figure 3:
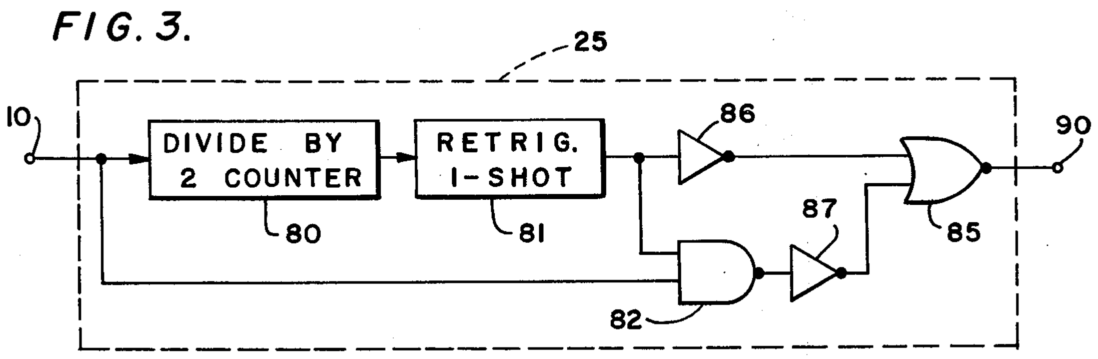
FIG. 3 is a more detailed block diagram of the rate sensor circuit 25 shown in FIG. 1

Referring to FIG. 3, the speed sensing circuit 25 is shown in greater detail. Its purpose is to provide still finer tuning at very low tuning rates in the linear mode. Pulses applied to the terminal 10 step a counter 80. The output of the counter 80 is a pulse train which is provided as an input to activate a retriggerable one-shot 81. Pulses from the one-shot 81 are applied directly to one input of a NAND gate 82, and to one input of a NOR gate 85 through an inverter 86. The NAND gate 82, whose second input is applied from the terminal 10, supplies pulses through an inverter 87 to the NOR gate 85. The output of the NOR gate 85 is connected via terminal 90 to the NAND gate 26 (FIG. 1).

Pulses generated by the shaft encoder 13 and applied at terminal 10 are reduced in number by the counter 80 before being used to trigger the one-shot 81. Once triggered, the one-shot 81 produces a logic 1 on its output for some predetermined length of time, that length of time being readily adjustable by the designer for a given application. If the number of pulses applied at terminal 10 is below a certain threshold, the one-shot 81 periodically inhibits the NAND gate 82, allowing only every other pulse appearing at input 10 to pass through NAND gate 82, inverter 87 and NOR gate 85 to the output 90. Above that threshold, however, the one-shot 81 becomes continuously triggered and all pulses appearing at input 10 pass through to output 90. For example, one-shot 81 could be adjusted to have an unstable state duration of 10 ms. So long as the tuning knob were rotated slowly enough that the pulses at terminal 10 were greater than 10ms apart, only one pulse would appear at terminal 90 for every two pulses applied at terminal 10. An increase in the pulse rate at terminal 10 to provide pulses less than 10ms apart would cause one-shot 81 to remain triggered, continuously enabling NAND gate 82 and allowing all pulses applied to terminal 10 to pass through NAND gate 82, inverter 87 and NOR gate 85 to terminal 90.

Figure 4:
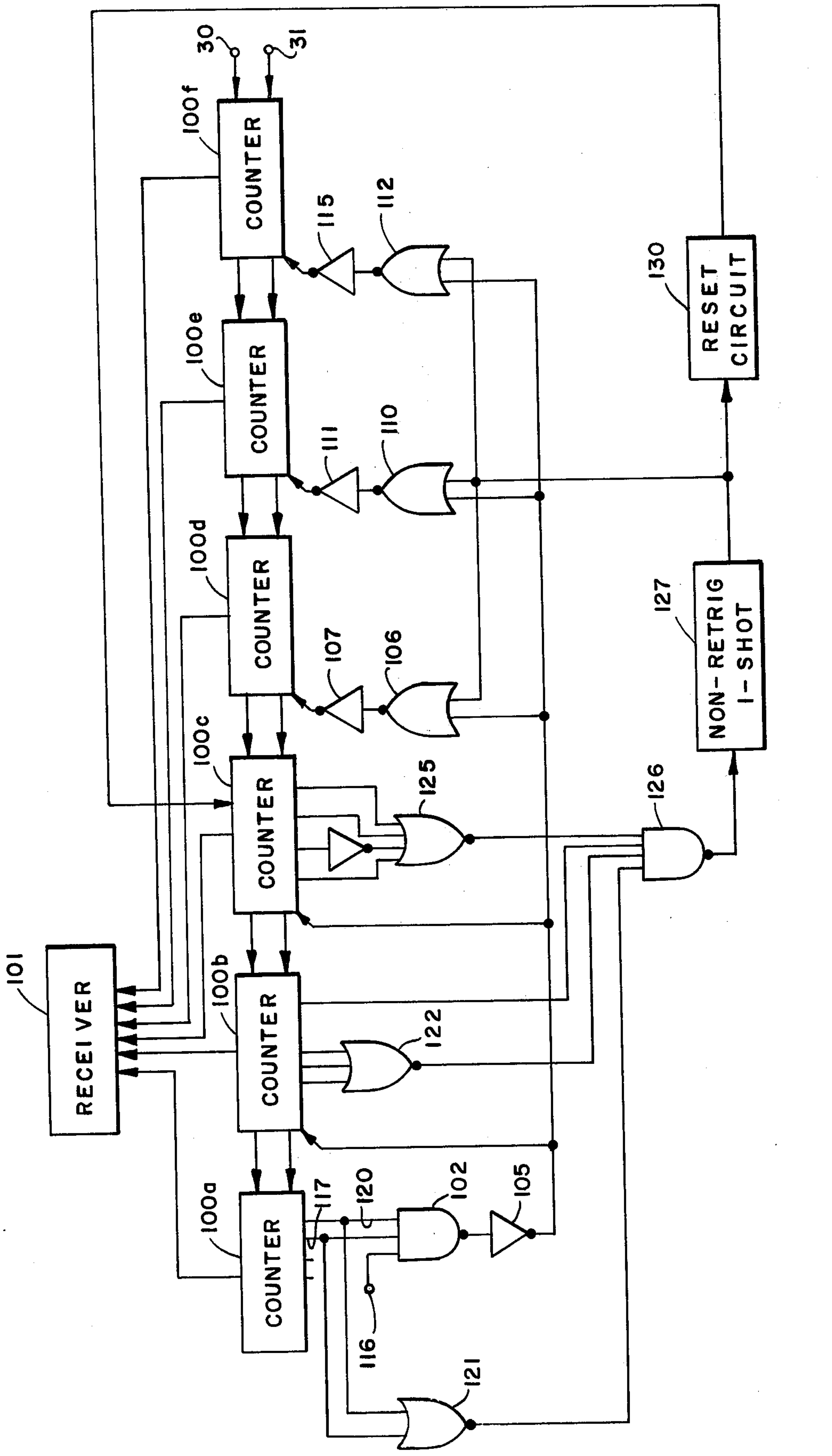
FIG. 4 is a block diagram of a tuning apparatus comprising counter and display circuit adapted for use with the circuit of FIG. 1.

Referring to FIG. 4, the output pulses generated by the circuit of FIG. 1 are gated through terminals 30 and 31 to a series of programmable BCD counters **100*a*–100*f* which, together with their associated circuitry, effect the actual tuning of a receiver 101. The number of counters is determined by both the frequency range over which the receiver is to be tuned and the smallest increment of tuning. For purposes of illustration, a receiver to be tuned from 1.5MHz to 30MHz in increments of 100Hz is presumed. As the operator rotates the tuning knob 14 to tune up the frequency scale, the resulting pulses at terminal 31 cause a corresponding increase in the value held within the counters 100*a*–100*f*, thereby creating a corresponding increase in the tuned frequency of the receiver. Similarly, as the operator rotates the tuning knob 14 to tune down the frequency scale, the pulses at terminal 30** cause the counter contents to decrease, thereby creating a corresponding decrease in the tuned frequency of the receiver.

The remaining circuitry shown in FIG. 4 serves the purpose of limiting the counter contents to the values representing a maximum of 30MHz and a minimum of 1.5MHz. If different frequency scales are needed, corresponding adjustments in the limiting circuitry would be necessary. The circuitry for limiting the counter values to the 30MHz representation consists of a 3-input NAND gate 102 whose output is coupled to an inverter 105. This inverter is coupled directly to the reset input of counters **100*b* and 100*c*, and through NOR gate-inverter pairs 106–107, 110–111 and 112–115 to the reset inputs of the counters 100*d*, 100*e* and 100*f* respectively. As the operator tunes up the frequency scale, the signal at terminal 116 remains at a logic 1. When the counters 100*a*–100*f* reach 30MHz, represented by the value 0011 in the counter 100*a*, the lines 117 and 120 each carry a logic 1 signal to the NAND gate 102. The resulting 0 output of the NAND gate 102, which becomes a 1 when passed through the inverter 105, continuously resets the counters 100*b*–100*f*** to 0, thereby prohibiting further incrementing of the counters. In this way, the counters are prohibited from increasing beyond the 30MHz representation.

The limiting circuitry to prohibit the counters **100*a*–100*f* from attaining a value below the 1.5MHz representation consists of the NOR gates 121, 122, and 125 which couple the counters 100*a*, 100*b* and 100*c* respectively to a NAND gate 126; a non-retriggerable one-shot 127 which couples the NAND gate 126 through the NOR gate-inverter pairs 106–107, 110–111, and 112–115 to the counters 100*d*, 100*e* and 100*f* respectively; and a reset circuit 130 which couples the non-retriggerable one-shot 127 to the counter 100c. The 1.5MHz lower frequency limit is detected as follows: as the frequency falls below 10MHz, the counter 100*a* goes to 0000. The resulting 0 inputs to the NOR gate 121 create a logic 1 on the first input of the NAND gate 126. As the tuned frequency falls below 2MHz, the contents of the counter 100*b* go to 0001. The three 0 outputs of the counter 100*b* are passed to the NOR gate 122, with a resulting logic 1 signal appearing at the second input of the NAND gate 126. The 1 value in the counter 100*b* is passed directly to the third input of the NAND gate 126. Finally, as the frequency representation falls below 1.5MHz, i.e., as the value in counter 100*c* goes to 0100, the output of the NOR gate 125 goes to logic 1, that signal being coupled to the fourth input of the NAND gate 126. At this point all four inputs of the NAND gate 126 are logic 1, causing a resulting 0 pulse which triggers the one-shot 127. The resulting logic 1 at the output of the one-shot 127 causes the counters 100d, 100*e* and 100*f* to be reset to zero, and also triggers the reset circuit 130. The programmable nature of the counter 100c makes it easily possible to load a predetermined BCD value into it upon a signal from the reset circuit 130. In this embodiment, with 1.5MHz being the lowest allowable frequency, the value 0101 is loaded into counter 100c when reset circuit 130** is triggered. Therefore, even though "*down*" pulses continue to be present at the input terminal 30, the contents of the counter 100c continually alternates between 0101 and 0100, the result being that the tuned frequency of the receiver is reset to 1.5MHz if the attempt is made to tune below that limit.

It is to be understood that the frequency ranges, frequency tuning rates and gating configuration may be varied widely without departing from the spirit and scope of the invention which is intended to be limited only by the appended claims.

What we claim is:

1. A frequency control apparatus for effecting fine/-coarse tuning by means of a single tuning knob, comprising:

means for providing a first pulse train whose rate is proportional to the rate of rotation of the tuning knob;

means for comparing the rate of the first pulse train with a predetermined rate;

means for providing a second pulse train, the second pulse train having a rate greater than the predetermined rate;

a tuning apparatus; and means for switching to the tuning apparatus the first pulse train if the rate of the first pules train is less than the predetermined rate, and the second pulse train if the first pulse train is greater than the predetermined rate.

2. The apparatus of claim 1 wherein the switching means includes means for detecting the direction of rotation of the tuning knob, the direction information being used to determine the direction of frequency tuning.

3. The apparatus of claim 2 wherein the rate-comparing means includes:

means for providing a constant pulse width reference;

means for providing a pulse whose width is proportional to that of the first pulse train; and means for comparing the pulse with the pulse width reference.

4. The apparatus of claim 3 wherein the switching means is coupled to the tuning apparatus through a pair of terminals, one of which receives pulses from the switch for tuning up the frequency scale and the other of which receives pulses from the switch for tuning down the frequency scale.

5. The apparatus of claim 4 wherein the rate-comparing means includes:

a retriggerable monostable multivibrator having an unstable state of some predetermined period after being triggered by a pulse from the first pulse train;

a non-retriggerable monostable multivibrator having an unstable state of some predetermined period which is fractionally longer than the period of the retriggerable multivibrator, and which is triggered by a pulse from the first pulse train; and means for detecting whether the non-retriggerable multivibrator has returned to its stable state before the retriggerable multivibrator has been retriggered by the next pulse from the first pulse train.

6. The apparatus of claim 5 wherein the means for providing the first pulse train includes an electronic optical shaft encoder.

7. The apparatus of claim 6 wherein the pulse trains are digital pulse trains.

8. A frequency control apparatus for effecting fine/-coarse tuning by means of a single tuning knob, comprising:

means for providing a first pulse train whose rate is proportional to the rate of rotation of the tuning knob;

means for comparing the rate of the first pulse train with a first and a second predetermined rate, the second predetermined rate being greater than the first predetermined rate;

means for generating a second and a third pulse train, the third pulse train having a rate greater than the second pulse train and the second pulse train having a rate greater than the second predetermined rate;

a tuning apparatus; and means for switching to the tuning apparatus, the first pulse train if the rate of the first pulse train is less than the first predetermined rate, the second pulse train if the rate of the first pulse train is greater than the first predetermined rate but less than the second predetermined rate, and the third pulse train if the rate of the first pulse train is greater than the second predetermined rate.

* * * * *

UNITED STATES PATENT OFFICE
CERTIFICATE OF CORRECTION

Patent No. 3,878,488 Dated April 15, 1975

Inventor(s) Wayne T. Blythe and Albert J. Milheizler

It is certified that error appears in the above-identified patent and that said Letters Patent are hereby corrected as shown below:

On the heading on the first page of the specification, the name of the co-inventor should read --Albert J. Milheizler--.

Signed and Sealed this

*fifth* Day of *August 1975*

[SEAL]

*Attest:*

RUTH C. MASON
*Attesting Officer*

C. MARSHALL DANN
*Commissioner of Patents and Trademarks*